United States Patent [19]
Butash

[11] Patent Number: 6,091,704
[45] Date of Patent: Jul. 18, 2000

[54] DIGITAL MULTI-CHANNEL DEMULTIPLEXER/MULTIPLEXER (MCD/M) ARCHITECTURE

[75] Inventor: Thomas C. Butash, Centreville, Va.

[73] Assignee: Lockheed Martin Corporation, Bethesda, Md.

[21] Appl. No.: 09/241,313

[22] Filed: Feb. 1, 1999

Related U.S. Application Data

[63] Continuation of application No. 08/884,650, Jun. 27, 1997, Pat. No. 5,867,479.

[51] Int. Cl.⁷ ........................................................ H04J 1/05
[52] U.S. Cl. ...................... 370/210; 370/480; 364/724.16
[58] Field of Search ..................................... 370/210, 480, 370/203, 208, 260, 344, 484, 481; 364/724.16, 724.01, 728.03, 726.02

[56] References Cited

U.S. PATENT DOCUMENTS

| | | | |
|---|---|---|---|
| 4,754,449 | 6/1988 | Crookshanks | 370/210 |
| 4,785,447 | 11/1988 | Ichiyoshi | 370/210 |
| 4,792,943 | 12/1988 | Gockler | 370/210 |
| 4,839,889 | 6/1989 | Gockler | 370/210 |
| 4,896,320 | 1/1990 | Gockler | 370/492 |
| 5,268,905 | 12/1993 | Soloff | 370/210 |
| 5,293,329 | 3/1994 | Wishart | 370/210 |
| 5,293,382 | 3/1994 | Carson | 370/210 |
| 5,299,192 | 3/1994 | Guo et al. | 370/210 |
| 5,323,391 | 6/1994 | Harrison | 370/210 |
| 5,396,489 | 3/1995 | Harrison | 370/210 |
| 5,587,939 | 12/1996 | Soleyamni et al. | 364/724.16 |
| 5,867,479 | 2/1999 | Butash | 370/210 |

*Primary Examiner*—Douglas W. Olms
*Assistant Examiner*—Ken Vanderpuye
*Attorney, Agent, or Firm*—Lane, Aitken and McCann

[57] ABSTRACT

A digital signal processing system for multiplexing/demultiplexing a large number of closely spaced FDM channels in which sub-band definition filtering divides the FDM spectral band comprised of "N" channels into "K" sub-bands in order to reduce the dimension of the polyphase filter fast Fourier transform structure required to complete the multiplexing/demultiplexing. This reduces the order of the required prototype filter by a factor proportional to K. The number of sub-bands K is chosen so that it is large enough to ensure the polyphase filter, fast Fourier transform structure for each sub-band is realizable within a finite word length, fixed point arithmetic implementation compatible with a low power consumption. To facilitate efficient sub-band definition filtering, the real basebanded composite signal is inputted at a spectral offset from DC equal to one quarter the FDM channel bandwidth for the N channels and the signal is sampled at a frequency 50% greater than the applicable Nyquist rate. The quarter band spectral offset and oversampling by 50% above the theoretical Nyquist rate facilitate the use of computationally efficient bandshift and symmetric half-band Finite Impulse Response (FIR) filtering.

10 Claims, 9 Drawing Sheets

DIGITAL MULTI-CHANNEL DEMULTIPLEXER/MULTIPLEXER (MCD/M) ARCHITECTURE

This application is a continuation of U.S. application Ser. No. 08/884,650, now U.S. Pat. No. 5,867,479 filed Jun. 27, 1997.

BACKGROUND OF THE INVENTION

1. Field of the Invention

This invention relates to an improved digital signal processing method and apparatus for demultiplexing and multiplexing frequency division multiplexed channels and more particularly, to a lightweight, compact, low power system which synthesizes a polyphase filter, fast Fourier transform architecture suitable for use in applications with a large number of channels.

DESCRIPTION OF THE PRIOR ART

Figure 1:
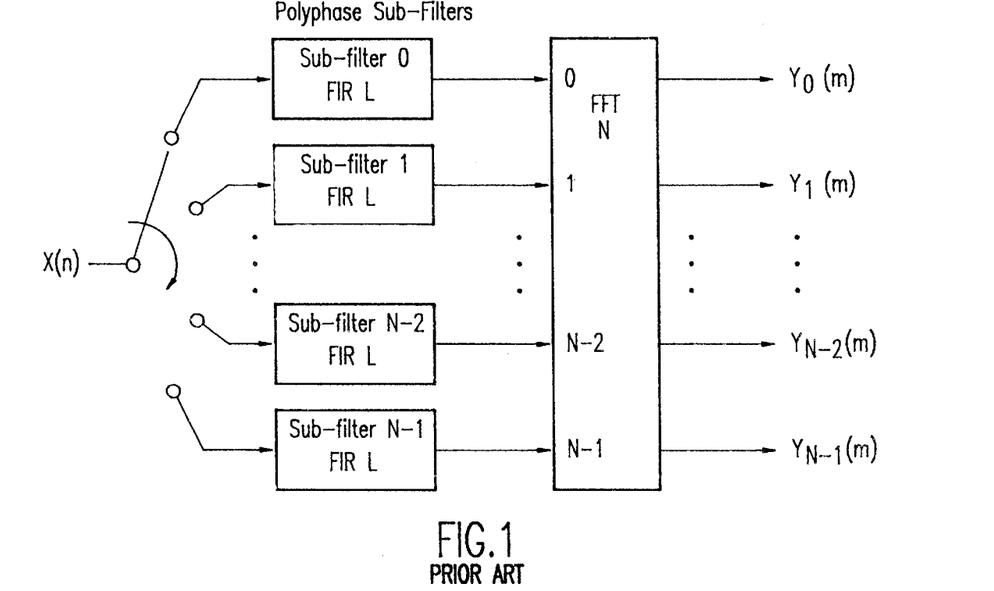
FIG. 1 is a functional block diagram of a prior art polyphase filter-fast Fourier transform (PPF-FFT) demultiplexer for an N channel FDM signal.
Figure 2:
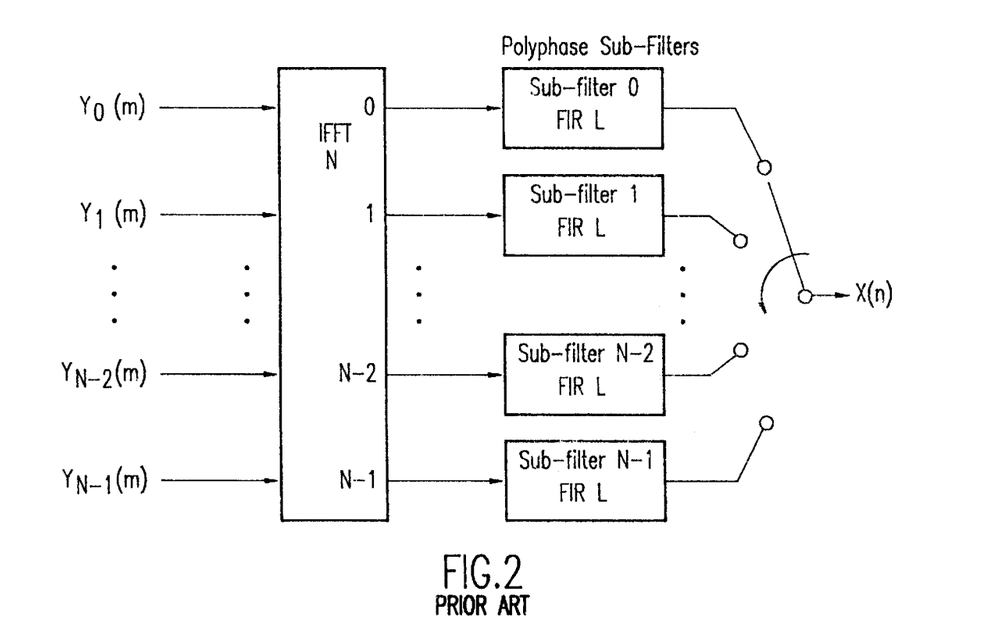
FIG. 2 is a functional block diagram of a prior art IFFT-PPF multiplexer for an N channel FDM signal.

In the prior art, digital polyphase filters (PPFs) are used in combination with fast Fourier transform (FFT) algorithms to efficiently demultiplex multiple, frequency division multiplexed (FDM) channels. Similarly, the polyphase filters are used in combination with inverse FFT algorithms to multiplex separate signals onto FDM channels. An N branch polyphase filter is realized by factoring (or partitioning) a desired prototype filter's transfer function (or impulse response) into N sub-filters. When coupled with an N point FFT (or IFFT) as shown in FIGS. 1 and 2, an N branch PPF can be used to implement a bank of N bandpass, N:1 decimating (or 1:N interpolating) filters for demultiplexing (or multiplexing) up to N FDM channels. The MCD/M thus realized represents the most computationally efficient system known for both demultiplexing and multiplexing large numbers of FDM channels.

The minimum order necessary to synthesize the required polyphase prototype filter is dictated by the ratio of the guard frequency band (separating adjacent FDM channels) to channel center frequency spacing, filter passband gain uniformity, channel cross-talk attenuation requirements, and the number, N, of FDM channels to be either demultiplexed or multiplexed. Given a fixed guard band to channel spacing ratio and fixed filter response requirements, the minimum order of the polyphase prototype filter grows linearly with N.

Cellular, Personal Communication Systems (PCSs) and other emerging telecommunications applications continue to demand increasingly larger numbers of ever more closely packed FDM communications channels. Such systems (e.g., satellite based cellular systems) often place stringent constraints on the power, mass and physical dimensions of the digital MCD/M subsystem designed to generate the constituent FDM communications channels. These constraints necessitate the use of short sample word lengths (e.g., from 8 to 12 bits) and fixed point arithmetic in any practically realizable MCD/M system for the applications in question Short sample word lengths and fixed point arithmetic are, however, inherently incompatible with accurate, high order prototype filter realizations. Indeed, in some applications, the indicated (higher order prototype) polyphase filter may not even be physically realizable within the finite word length and fixed point arithmetic dimensions necessary to meet the MCD/M subsystem's power, mass and size constraints.

BRIEF DESCRIPTION OF THE INVENTION

An object of this invention is the provision a computationally efficient digital signal processing system, which synthesizes a polyphase filter-fast Fourier transform or inverse fast Fourier transform combination to respectively demultiplex or multiplex a large number of closely spaced FDM channels. That is, the provision of such a digital signal processing system that can be implemented as a small size, lightweight device with low power consumption for multiplexing and demultiplexing a large number of closely spaced FDM channels.

Briefly, this invention contemplates the provision of a digital signal processing system for multiplexing/demultiplexing a large number of closely spaced FDM channels in which sub-band definition filtering divides the FDM channel band comprised of "N" channels into "K" sub-bands in order to reduce the dimension of the polyphase filter-fast Fourier transform structure required to complete the multiplexing/demultiplexing. This reduces the order of the required prototype filter by a factor proportional to K. The number of sub-bands K is chosen so that it is large enough to ensure the polyphase filter-fast Fourier transform structure for each sub-band is realizable within a finite word length, fixed point arithmetic implementation compatible with a low power consumption. To facilitate efficient sub-band definition filtering, the real basebanded composite signal is inputted at a spectral offset from DC equal to one quarter the aggregate FDM channel bandwidth for the N channels and the signal is sampled at a frequency 50% greater than the applicable Nyquist rate. The quarter band spectral offset and oversampling by 50% above the theoretical Nyquist rate facilitate the use of computationally efficient bandshift and symmetric half-band Finite Impulse Response (FIR) filtering.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 3:
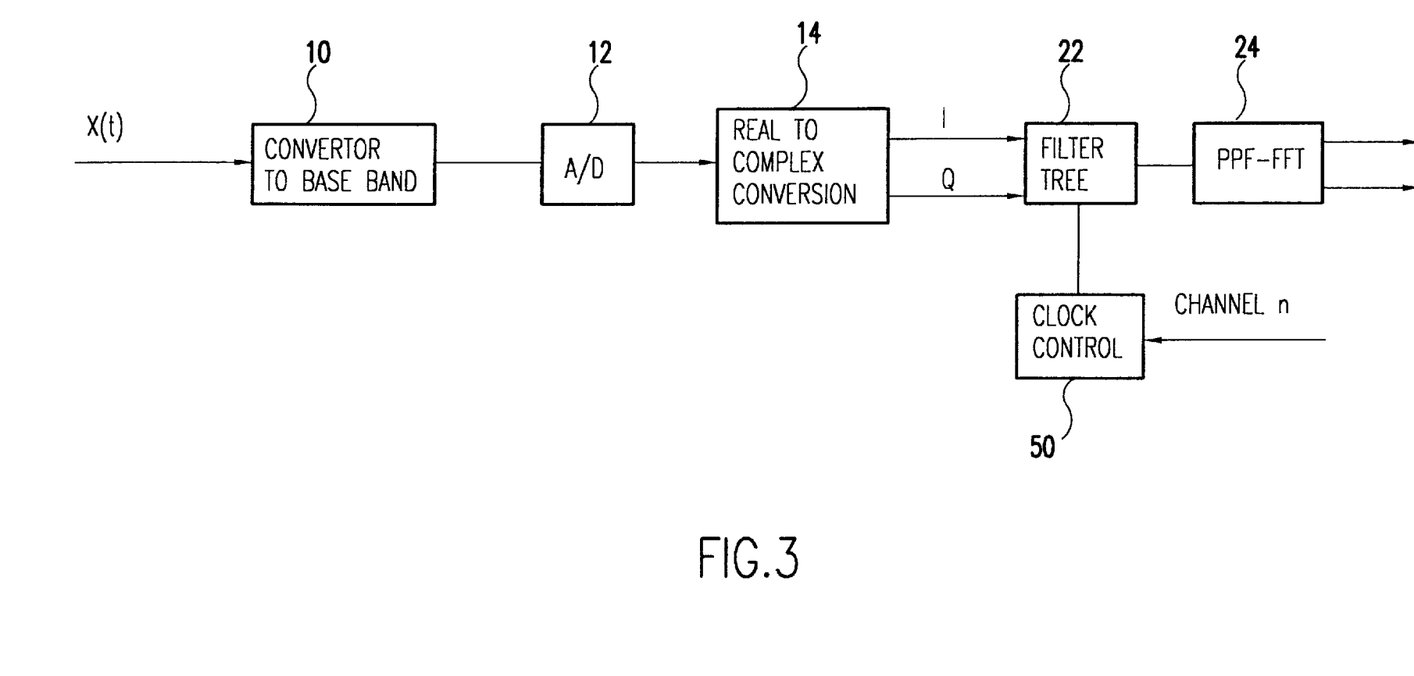
FIG. 3 is a simplified block diagram of an FDM demultiplexing system in accordance with the teachings of this invention.
Figure 4:
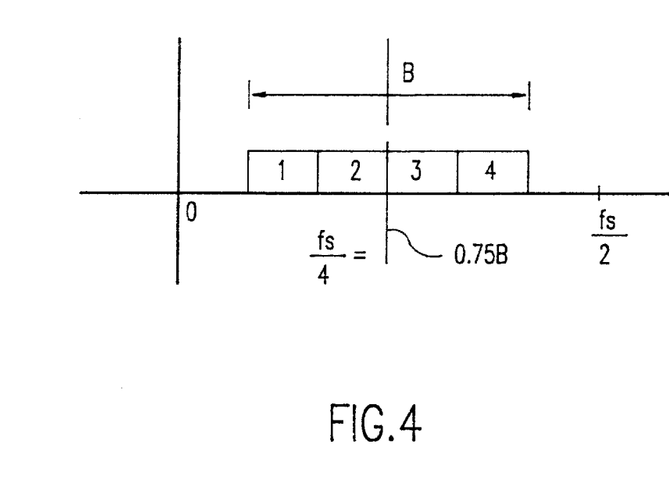
FIG. 4 is an idealized diagram illustrating a real, composite FDM signal with spectral offset from DC equal to one quarter of the signal bandwidth.

Referring now to FIGS. 3 and 4, an RF, N channel FDM signal X(t) of bandwidth B is coupled to the input of an RF to baseband down convertor stage 10, which converts the received RF signal to a baseband signal off-set from DC by one quarter of the FDM signal bandwidth B, as illustrated in FIG. 4. That is, the center frequency of the basebanded signal is located at a frequency equal to 0.75 times the bandwidth B. As will be appreciated by those skilled in the art, prior art digital multi-channel multiplex and demultiplex signal processing systems accept their composite input signals, consisting of up to N constituent FDM communications channels, centered at a practical intermediate baseband frequency. Due to imperfections in analog bandpass and anti-aliasing filtering and mixing (frequency downconversion), it is usually necessary to offset the basebanded composite signal band from DC. In accordance with the teachings of this invention, the composite signal's basebanded spectral location and sampling frequency are chosen to maximize the efficiency of the subsequent digital MCD/M signal processing. The real basebanded composite signals are inputted to the digital signal processing stages at a DC spectral offset of one quarter of the composite FDM signal bandwidth and, an analogue to digital convertor 12 samples the composite input signal at a frequency that is 50% higher than the applicable Nyquist rate. This quarter band spectral offset and oversampling by 50% above the theoretical Nyquist rate facilitate the use of computationally efficient bandshift and symmetric half-band FIR filtering operations to generate and subsequently process the corresponding analytic signal.

Figure 5:
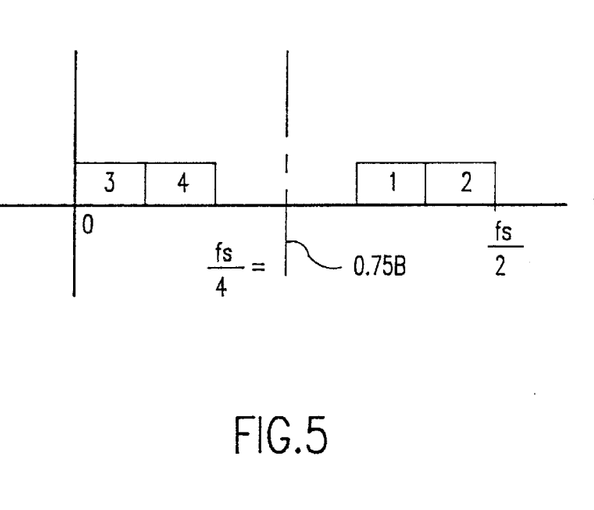
FIG. 5 is an idealized diagram illustrating the complex representation of the signal shown in FIG. 4.

A real-to-complex conversion processor 14 digitally generates a complex basebanded signal (illustrated in FIG. 5) in response to the over sampled, DC quarterband offset output of A/D convertor 12. A functional block diagram of processor 14 is shown in FIG. 6.

Figure 6:
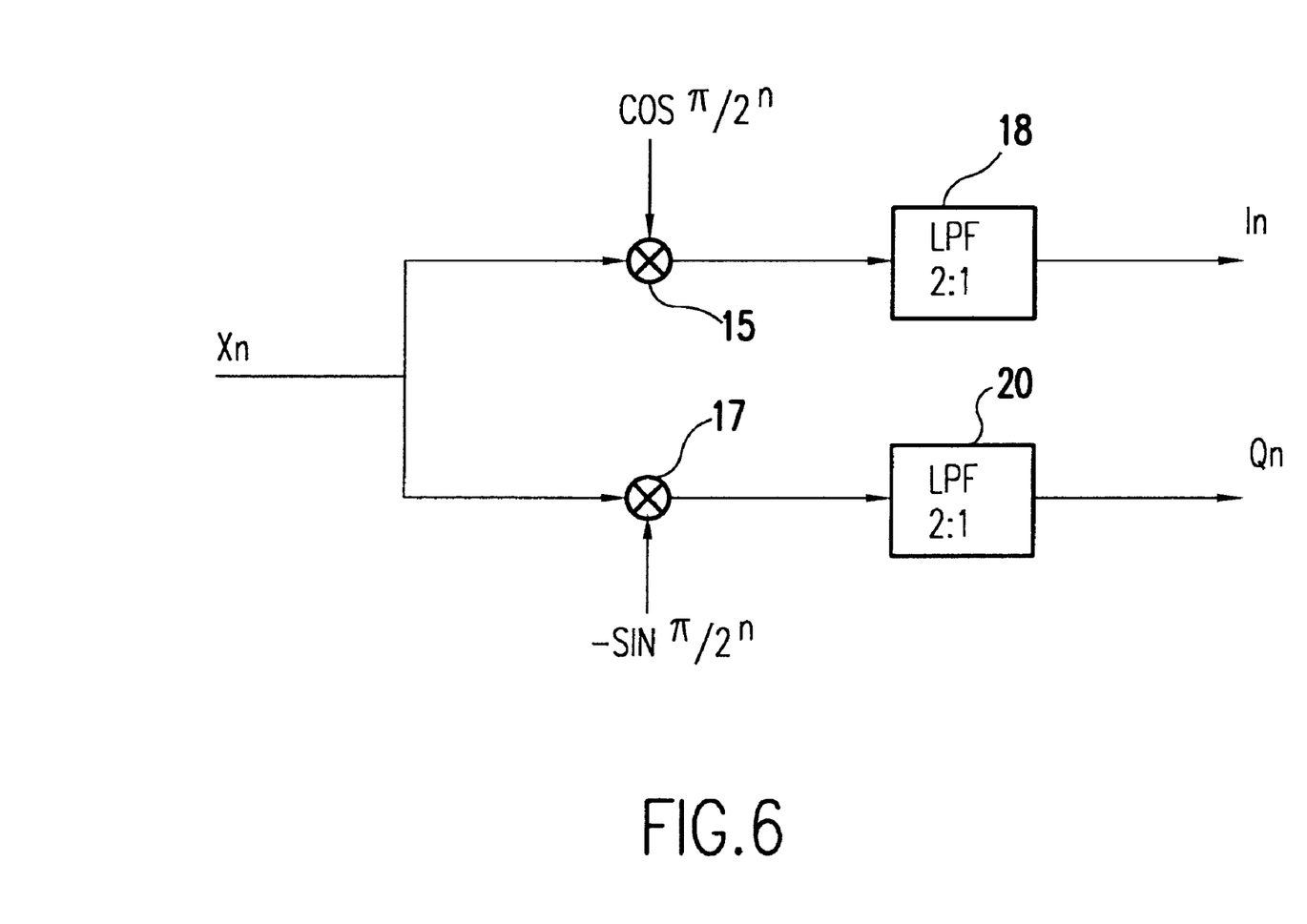
FIG. 6 is a functional block diagram of a real-to-complex process for converting the real composite FDM signal into its corresponding complex representation.

Referring now to FIG. 6, the real signal $x_n$ outputted from the A/D convertor 12 is functionally coupled as an input to two multipliers 15 and 17 where the signal $x_n$ is multiplied by the functions cos $(\pi/2)n$ and $-\sin (\pi/2)n$ respectively. The outputs of the multipliers 15 and 17 are coupled as inputs to identical, low order, symmetric, half-band, 2:1 decimating, finite impulse response (FIR) filters 18 and 20. The real and quadrature outputs $I_n$ and $Q_n$ of the filters 18 and 20 are coupled as inputs to a filter tree 22, whose outputs in turn are coupled to a PPF-FFT 24.

Here it should be noted, the architecture's unique combination of input signal spectral location and sampling rate substantially reduces the complexity of this processing. The processor 14 (shown in FIG. 6) generates a digital, complex baseband signal with a simple quarter band complex bandshift (requiring no actual multiples; the indicated function of multiplication by cos $(\pi/2)n$ and $-\sin (\pi/2)n$ can be performed by simply outputting the input sample $X_n$, the input sample with its sign changed, $-X_n$, or zero as appropriate), followed by a low order symmetric half-band 2:1 decimating FIR filter. The signal thus generated is equivalent to the complex input signal that would have been obtained from sampling the corresponding analog quadrature basebanded signal. The filter tree 22 and PPF-FFT 24 are designed to efficiently process this common, complex basebanded input signal.

Figure 7:
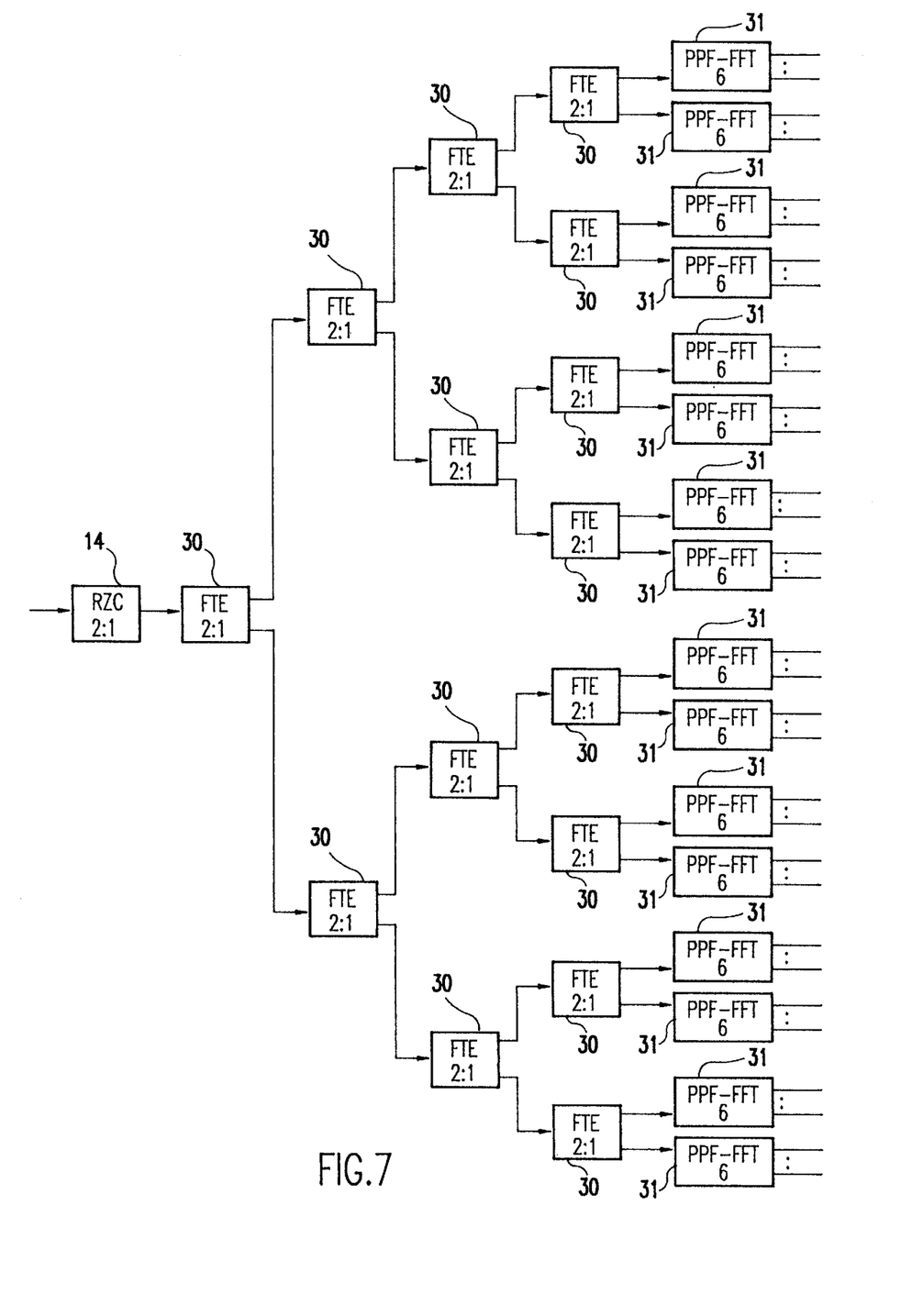
FIG. 7 is a functional block diagram of a filter tree and PPF-FFT demultiplexer stages in accordance with the teachings of this invention for a sixty-four channel FDM signal.

Referring now to FIG. 7 in addition to FIG. 3, the complex, basebanded composite signal from real to complex conversion processor 14 is processed by filter tree element (FTE) 30 through k stages of a band definition filtering and decimation to produce $2^k$ sub-band signals. In the illustrative embodiment of FIG. 7, k=4. Each sub-band signal is subsequently demultiplexed with an $N'=3N/2^{k+1}$ channel PPF-FFT 31, where N is the dimension of the PPF-FFT structure that would have been required to demultiplex the original complex basebanded composite signal, without sub-band definition filtering, had it been sampled at the Nyquist rate.

The band definition filtering and decimation tree shown in detail in FIG. 7, is a tree-like structure of its serially concatenated Filtering Tree Elements (FTEs) 30. Each FTE 30 separates, and outputs, the lower and upper halves of its complex input signal's spectrum at half the input signal's sampling rate. At the output of the kth and final stage in the tree, the concatenated FTEs 30 have partitioned the original input signal band into $2^k$ sub-bands of equal bandwidth. Preferably, the smallest number of filtering tree stages, k, sufficient to ensure that the reduced dimension sub-band N' channel PPF is physically realizable, is used. In this specific example, four stages (k=4) are used to produce a sub-band (N'=6 channel) PPF to demultiplex a composite signal consisting of 64 channels.

Figure 8:
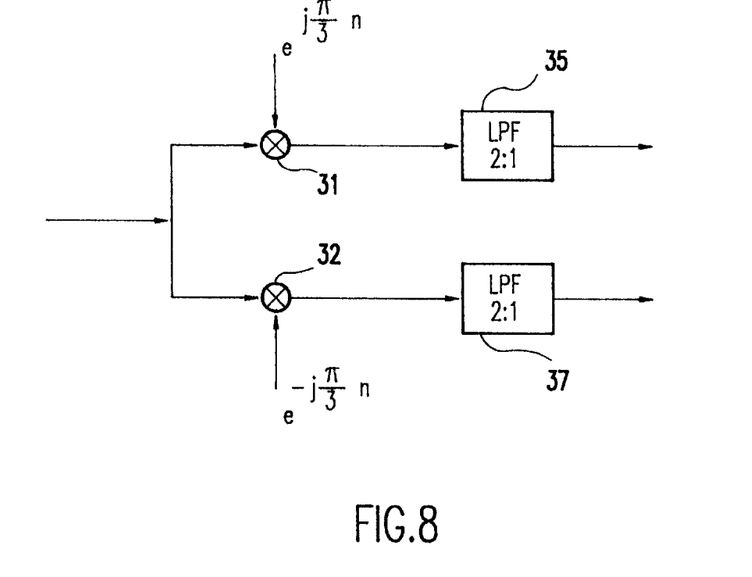
FIG. 8 is a functional block diagram of the Filter Tree Elements used in FIG. 7.

The spectral location and sampling rate of the input signal produced by the real-to-complex conversion processor 14 minimize the computational complexity of the FTE 30. The FTE 30 is shown in FIG. 8. Multipliers 31 and 32, respectively, functionally multiply the input by $$e^{j\frac{\pi}{3}n}$$

and $$e^{-j\frac{\pi}{3}n}$$

i.e. relatively simple positive and negative one-third band bandshifts (requiring an average of only 2 real multiplies for every three complex input samples) followed by low order symmetric half-band 2:1 decimating FIR filters 35 and 37. FTE 30 is used throughout the band definition filtering and decimation tree—only the FTE's FIR coefficients change, and then only as necessary to meet filtering requirements uniquely encountered at the subject FTE's location.

Figure 9:
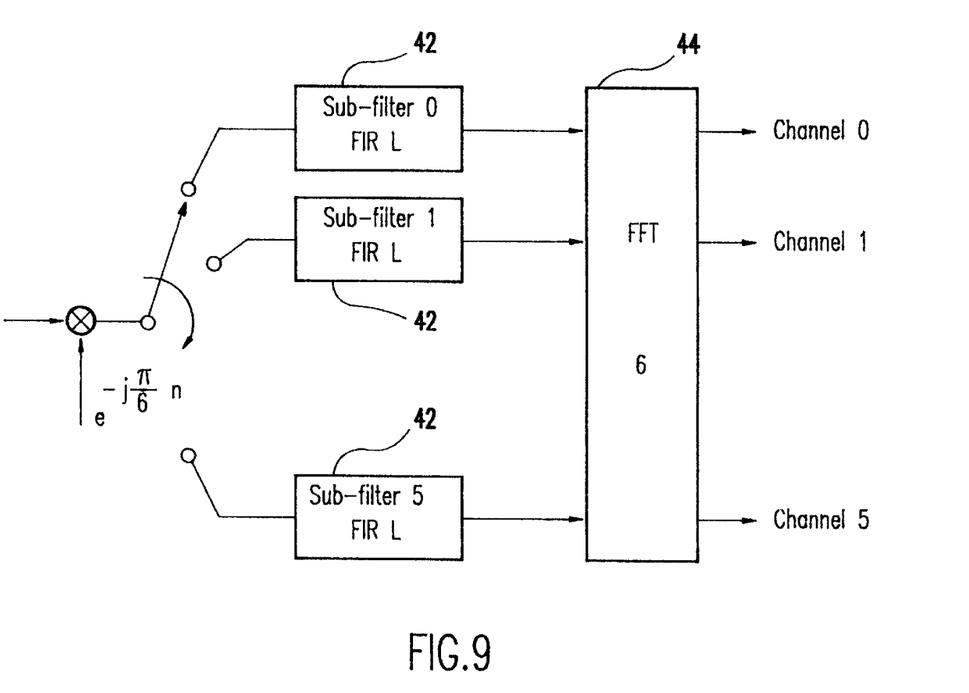
FIG. 9 is a functional block diagram of the final stage PPF-FFT 6 in FIG. 7.

The final stage FTEs 30 are coupled to an N' channel PPF-FFT 31 in order to demultiplex each sub-band and complete the demultiplexing process. In this specific exemplary embodiment of the invention, N'=6. As illustrated in FIG. 9, each PPF-FFT 31 is comprised of six polyphase subfilters 42 whose outputs are coupled into an N' point FFT 44, with N'=6.

Here, it should be noted that additional power can be saved by energizing only those FTEs 30 in the tree that are in a path for demultiplexing a channel of interest. For example, if the FTEs 30 are implemented in CMOS, control 50 disables the clock signal to the FTEs 30 in some or all paths, other than the path which includes the channel or channels of interest, in order to reduce power consumption.

The corresponding MCM architecture, as illustrated in FIGS. 10–13, is the mirror image, symmetric implementation of the MCD system described in conjunction with FIGS. 3–9, with the corresponding components in FIGS. 10–13 designated by same reference with a prime. The MCD architecture's FTE 2:1, PPF-FFT N', and R2C elements are replaced by their dual counterparts: the FTE 1:2, FFT-PPF N' and C2R elements, as shown in FIGS. 10–13 respectively, in the MCM architecture.

Figure 10:
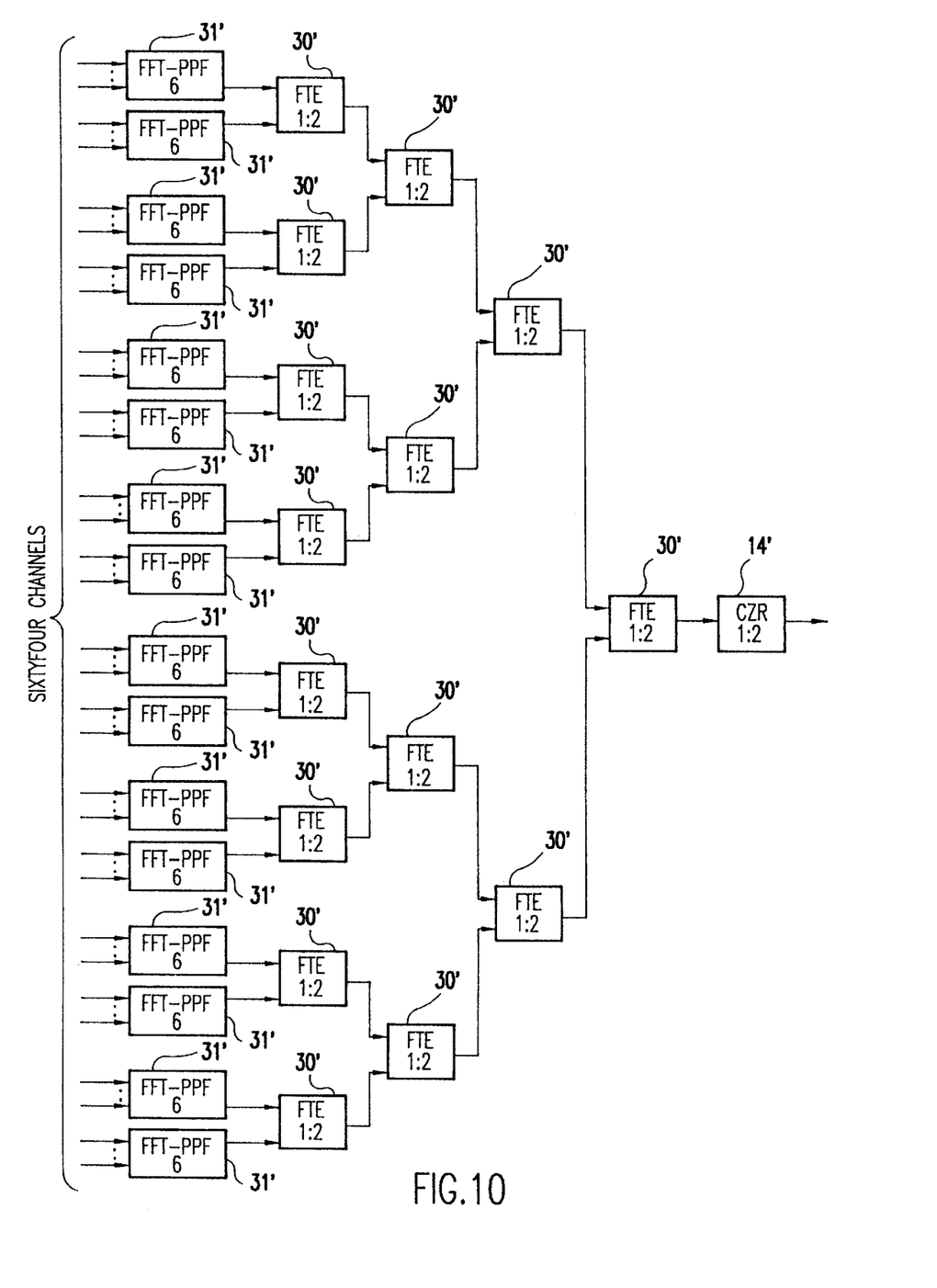
FIG. 10 is a functional block diagram similar to FIG. 7 of a multiplexer in accordance with the invention.
Figure 11:
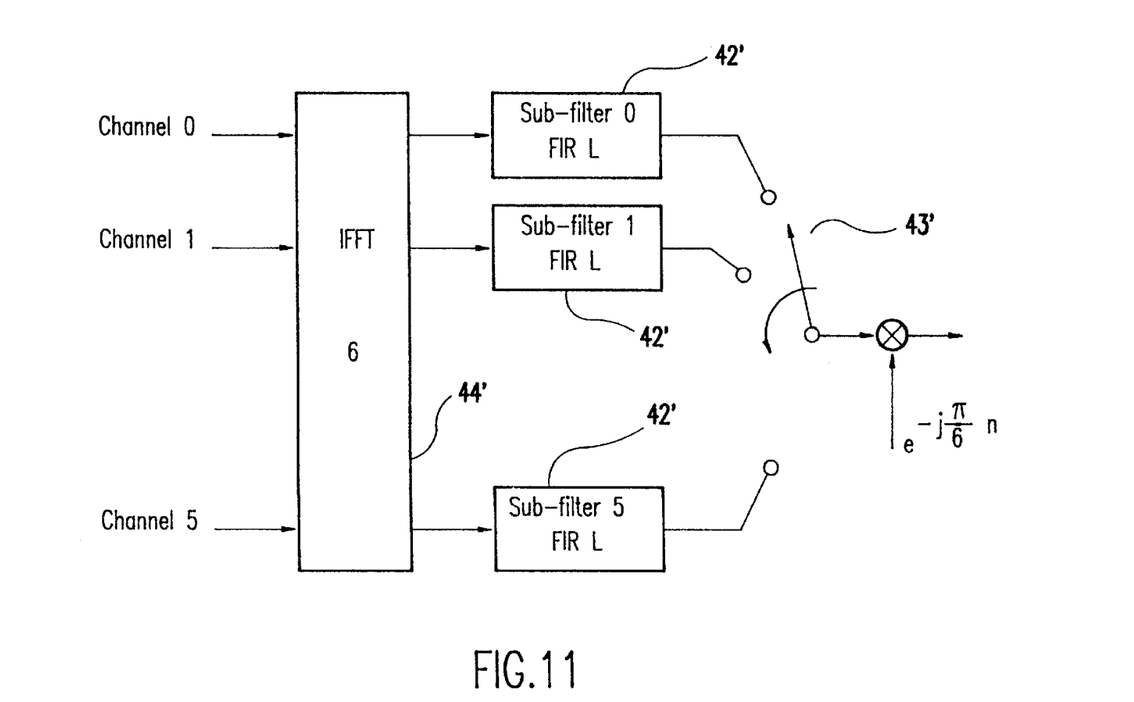
FIG. 11 is a functional block diagram of an IFFT-PPF element shown in FIG. 10.

Briefly, now referring to FIGS. 10 and 11, in this illustrative embodiment of the invention, sixty four digital signal channels, which are to be multiplexed, are coupled, in sixteen groups of four, to IFFT-PPFs 31' (the values of frequency bins 2 and 3 are set equal to zero). The outputs of two IFFT-PPFs are inputs to the first stages of a filter tree comprised of filter tree elements 30'. Each IFFT-PPF 31' is comprised of a six point inverse fast Fourier transform processor 44' with each output filtered by a finite impulse response polyphase subfilter 42'. Multiplexing switch 43' couples the outputs of the subfilters 42' to the input of the filter tree element 30'. The filter tree in this illustrative embodiment of the invention has four stages. Each stage combines and outputs the lower and upper halves of the output signal spectrum at twice the input signal sampling rate.

Figure 12:
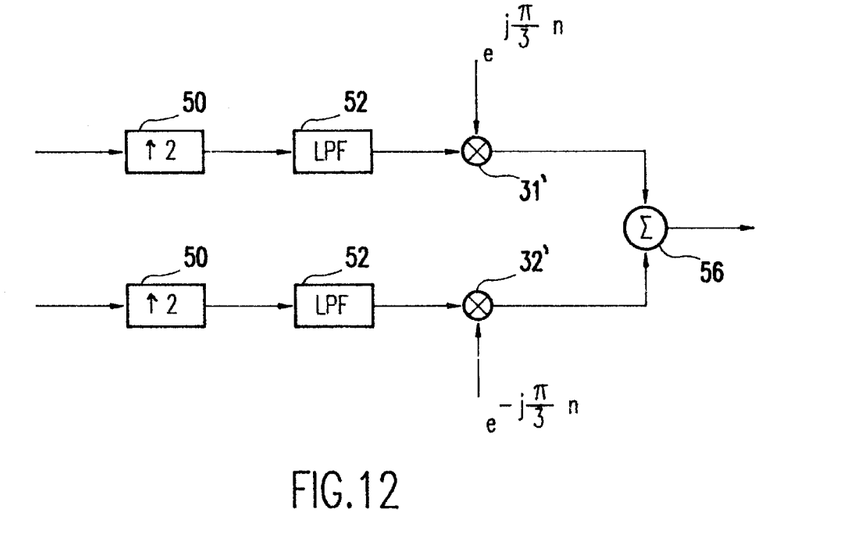
FIG. 12 is a functional block diagram of a Filter Tree Element shown in FIG. 10.

Referring now to FIG. 12, each filter tree element 30' is comprised of one-to-two interpolating stages 50, low pass filters 52, multipliers 31 and 32', and a summing junction 56. Multipliers 31' and 33', respectively, (functionally) multiply the input by $$e^{j\frac{\pi}{3}n}$$

and $$e^{-j\frac{\pi}{3}n}$$

relatively simple positive and negative one-third bandshifts (requiring an average of only 2 real multiplies for every three complex input samples).

Figure 13:
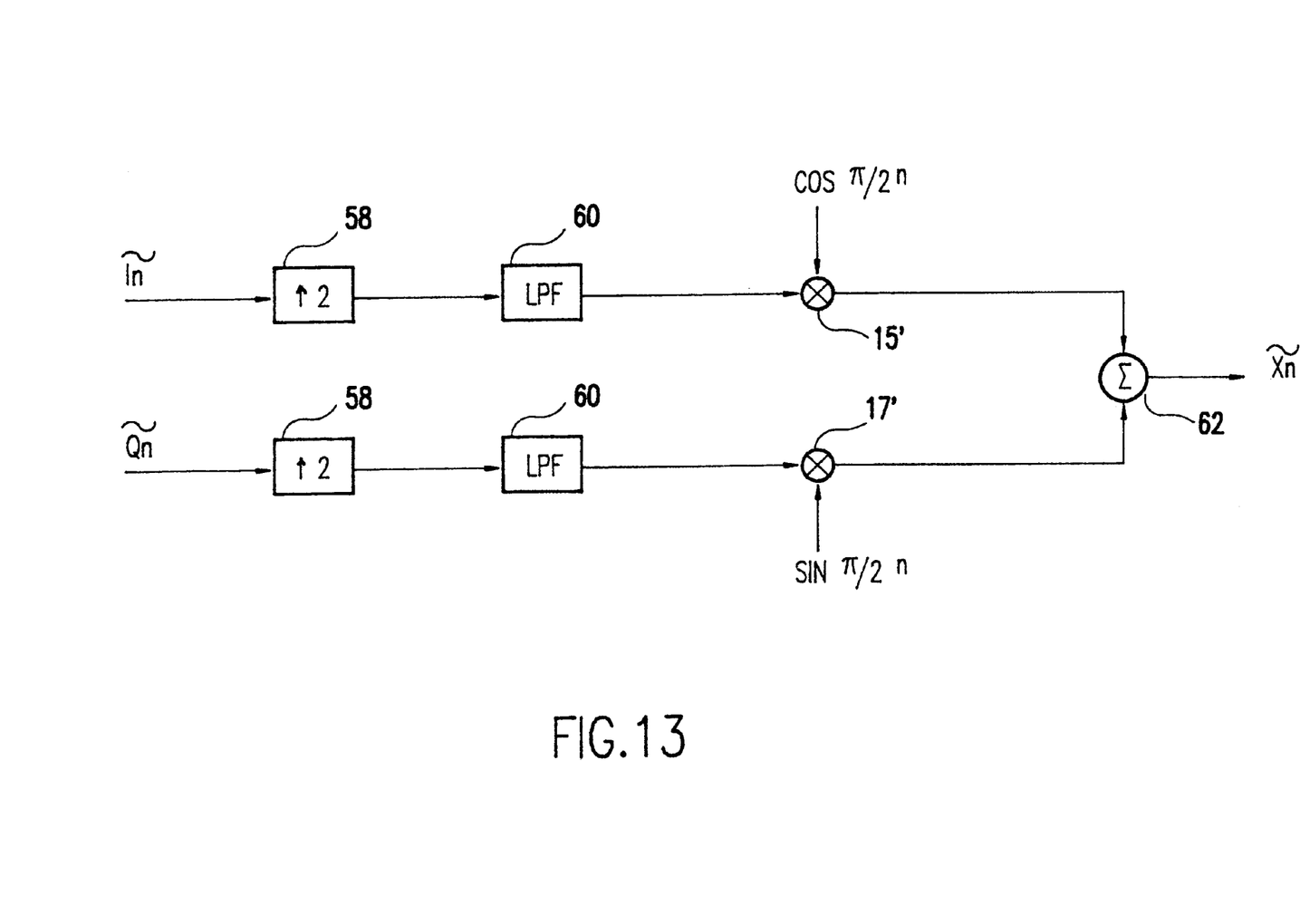
FIG. 13 is a functional block diagram of a complex to real conversion process element shown in FIG. 10.

Referring now to FIG. 13, the final stage of the filter tree is coupled to a complex to real conversion stage 14' comprised of one-to-two interpolating stages 58, low pass filters 60, multipliers 15' and 17', and summing junction 62. The output of the summing junction 62 is a real, digital, frequency division multiplexed signal of, in this illustrative example, the sixty four input channels.

These and other modifications may be made to the specific embodiment of the invention without departing from the spirit and scope of the invention.

I claim:

1. A system that demultiplexes an RF signal comprised of N frequency division multiplexed channels extending over a bandwidth B, the system comprising:
    a baseband convertor that converts said RF signal to a baseband signal whose center frequency is offset from DC by an amount equal to three quarters of the bandwidth B;
    an analog to digital converter, coupled to said baseband convertor, that converts said baseband signal to a digital signal at a sampling rate three times the bandwidth B;
    a complex baseband digital signal generator, coupled to said analog to digital converter, that generates a complex baseband digital signal by a quarterband complex bandshift of said digital signal and that filters said quarterband complex bandshifted signal with a two to one decimating, symmetric, half-band finite impulse response filter;
    a k stage filter tree, coupled to said complex baseband digital signal generator, that divides said complex baseband digital signal into $2^k$ sub-bands by sub-band definition filtering, wherein said k stage filter tree comprises one third band bandshifters and two to one decimating, symmetric, half-band finite impulse response filters; and
    a demultiplexer, coupled to the $2^k$ outputs of the final stage of said k stage filter tree, that demultiplexes each of the $2^k$ outputs with an N' channel polyphase-fast Fourier transform (FFT) filter bank, where $N'=3N/2^{k+1}$.

2. The system according to claim 1, wherein said complex baseband digital signal generator is configured to generate said quarterband complex bandshift without the use of multipliers and wherein each third band bandshifter, used in said k stage filter tree, is effected with two real multiplies for every three complex input signal samples.

3. The system according to claim 1, wherein the number of stages, k, of said k stage filter tree is selected such that said dimension, N', of the resulting polyphase-FFT filter bank facilitates the realization of this structure within application imposed limits on implementation power and mass.

4. The system according to claim 1, wherein said demultiplexer is implemented in CMOS, and the digital logic clock signal is disabled in branches of said k stage filter tree which contain only inactive channels, thereby minimizing power consumption in applications exhibiting active channel sparsity.

5. A system that multiplexes N complex digital channel signals to synthesize a frequency division multiplexed signal extending over a bandwidth B, the system comprising:
    a digital multiplexer that multiplexes said N complex digital channels in $2^k$ groups of $N/2^k$ channels with an N' channel inverse fast Fourier transform (IFFT)-polyphase filter bank, where $N'=3N/2^{k+1}$ and the values of the central $N/2^{k+12}$ frequency bins are set equal to zero;
    a k stage filter tree, coupled to said digital multiplexer, that concentrates said $2^k$ complex digital multiplexed signals into a single frequency division multiplexed complex digital signal, wherein said k stage filter tree comprises one to two interpolating, symmetric, half-band finite impulse response filters, one third band bandshifters and a summation operation;
    a real frequency division multiplexed digital signal generator, coupled to said k stage filter tree, that filters said complex frequency division multiplexed digital signal with a one to two interpolating, symmetric, half-band, real finite impulse response filter and that generates the real part of the quarterband complex bandshifted output of said one to two interpolating, symmetric, half-band, real finite impulse response filter.

6. The system according to claim 5, wherein said third band bandshifters, used in said k stage filter tree, are effected with two real multiplies for every three complex input signal samples, and said quarterband complex bandshift is accomplished without the use of multipliers.

7. The system according to claim 5, wherein the number of stages, k, of said k stage filter tree is selected Such that dimension, N', of the resulting IFFT-polyphase filter bank facilitates the realization of this structure within application imposed constraints on implementation power and mass.

8. The system according to claim 5, wherein said digital multiplexer is implemented in CMOS, and the digital logic clock signal is disabled in those branches of said filter tree which contain no active channels, thereby minimizing power consumption in applications exhibiting active channel sparsity.

9. A system for demultiplexing an RF signal comprised of N frequency division multiplexed channels extending over a bandwidth B, the system comprising:

first means for converting said RF signal to a baseband signal whose center frequency is offset from DC by an amount equal to three quarters of the bandwidth B;

second means for converting said baseband signal to a digital signal at a sampling rate three times the bandwidth B, coupled to said first means;

means for generating a complex baseband digital signal by a quarterband complex bandshift of said digital signal and for filtering said quarterband complex bandshifted signal with a two to one decimating, symmetric, half-band finite impulse response filter, coupled to said second means;

means for dividing said complex digital signal into $2^k$ sub-bands by sub-band definition filtering in a k stage filter tree comprised of one third band bandshifters and two to one decimating, symmetric, half-band finite impulse response filters, coupled to said generating means; and means for demultiplexing each of the $2^k$ outputs of the final stage of said k stage filter tree with an N' channel polyphase-fast Fourier transform (FFT) filter bank, where $N'=3N/2^{k+1}$, coupled to said dividing means.

10. A system for multiplexing N complex digital channel signals to synthesize a frequency division multiplexed signal extending over a bandwidth B, comprising:

means for multiplexing the N complex digital channels in $2^k$ groups of $N/2^k$ channels with an N' channel inverse fast Fourier transform (IFFT)-polyphase filter bank, where $N'=3N/2^{k+1}$ and the values of the central $N/2^{k+1}$ frequency bins are set equal to zero;

means for concentrating said $2^k$ groups of $N/2^k$ channels into a single frequency division multiplexed complex digital signal, comprising a k stage filter tree comprising one to two interpolating, symmetric, half-band finite impulse response filters, one third band bandshifters and a summation operation, coupled to said multiplexing means;

means for generating a real frequency division multiplexed digital signal, coupled to said concentrating means, including means for filtering said complex frequency division multiplexed digital signal with a one to two interpolating, symmetric, half-band, real finite impulse response filter and means for generating the real part of the quarterband complex bandshifted output of said one to two interpolating, symmetric, half-band, real finite impulse response filter.

* * * * *